United States Patent
Hulsebos

(10) Patent No.: US 9,665,012 B2
(45) Date of Patent: May 30, 2017

(54) LITHOGRAPHIC APPARATUS AND DEVICE MANUFACTURING METHOD

(71) Applicant: ASML Netherlands B.V., Veldhoven (NL)

(72) Inventor: Edo Maria Hulsebos, Waalre (NL)

(73) Assignee: ASML NETHERLANDS B.V., Veldhoven (NL)

( * ) Notice: Subject to any disclaimer, the term of this patent is extended or adjusted under 35 U.S.C. 154(b) by 131 days.

(21) Appl. No.: 14/431,229

(22) PCT Filed: Oct. 8, 2013

(86) PCT No.: PCT/EP2013/070891
§ 371 (c)(1),
(2) Date: Mar. 25, 2015

(87) PCT Pub. No.: WO2014/072139
PCT Pub. Date: May 15, 2014

(65) Prior Publication Data
US 2015/0241791 A1    Aug. 27, 2015

Related U.S. Application Data

(60) Provisional application No. 61/723,214, filed on Nov. 6, 2012.

(51) Int. Cl.
*G03B 27/68* (2006.01)
*G03F 7/20* (2006.01)

(52) U.S. Cl.
CPC .......... *G03F 7/70483* (2013.01); *G03F 7/709* (2013.01); *G03F 7/70516* (2013.01); *G03F 7/70775* (2013.01)

(58) Field of Classification Search
CPC ............. G03F 7/70483; G03F 7/70516; G03F 7/70775; G03F 7/709
See application file for complete search history.

(56) References Cited

U.S. PATENT DOCUMENTS 6,021,991 A * 2/2000 Mayama ................. F16F 15/02
                                                               188/267
6,128,552 A * 10/2000 Iwai ....................... F16F 15/002
                                                               248/550
(Continued)

FOREIGN PATENT DOCUMENTS

EP    1 637 930        3/2006
JP    2006-337373      12/2006
(Continued)

OTHER PUBLICATIONS

Japanese Office Action mailed Jan. 20, 2016 in corresponding Japanese Patent Application No. 2015-540083.
(Continued)

*Primary Examiner* — Deoram Persaud
(74) *Attorney, Agent, or Firm* — Pillsbury Winthrop Shaw Pittman LLP

(57) ABSTRACT

A method involving obtaining first calibration vibration data relating to vibrations of the lithographic apparatus from a sensor that is part of the lithographic apparatus and obtaining second calibration vibration data, the second calibration vibration data being a component of first parameter data of the lithographic apparatus. A filter is calculated from the first and second calibration vibration data, the filter being such that when applied to the first calibration vibration data, its output correlates closer with the second calibration vibration data. The filter can then be applied to vibration data obtained using the first sensor to obtain an estimate of a vibration component of the first parameter data during the lithographic process.

22 Claims, 5 Drawing Sheets

(56) References Cited

U.S. PATENT DOCUMENTS

| | | | |
|---|---|---|---|
| 6,343,188 B1* | 1/2002 | Morofuji | G03B 5/00 396/55 |
| 6,523,695 B1* | 2/2003 | Ueta | G03F 7/709 188/378 |
| 7,072,777 B1 | 7/2006 | Wakui et al. | |
| 7,308,368 B2 | 12/2007 | Kok et al. | |
| 7,411,667 B2 | 8/2008 | Van Asten et al. | |
| 8,164,635 B2* | 4/2012 | Watanabe | G03B 5/00 348/208.11 |
| 8,825,182 B2 | 9/2014 | Simons et al. | |
| 8,903,156 B2 | 12/2014 | Van De Mast et al. | |
| 2002/0140921 A1* | 10/2002 | Morisada | G03F 7/709 355/73 |
| 2003/0168574 A1* | 9/2003 | Watanabe | F16F 15/03 248/638 |
| 2005/0077986 A1* | 4/2005 | Nawata | G03B 27/52 335/72 |
| 2006/0058972 A1 | 3/2006 | Kok et al. | |
| 2006/0061746 A1* | 3/2006 | Kok | G03F 7/70666 355/53 |
| 2006/0274324 A1 | 12/2006 | Van Asten et al. | |
| 2008/0218720 A1* | 9/2008 | Mayama | G03F 7/709 355/67 |
| 2009/0153832 A1* | 6/2009 | Tatsuzaki | G03F 7/709 355/72 |
| 2009/0176167 A1* | 7/2009 | Hulsebos | G03B 27/42 430/22 |
| 2010/0182585 A1* | 7/2010 | Heertjes | G03F 7/70725 355/72 |
| 2011/0164230 A1* | 7/2011 | Ito | G03F 7/70725 355/53 |
| 2012/0019801 A1 | 1/2012 | Simons et al. | |
| 2012/0156807 A1 | 6/2012 | Van De Mast et al. | |
| 2013/0037687 A1* | 2/2013 | Furumoto | F16F 15/002 248/550 |
| 2015/0153659 A1* | 6/2015 | Nawata | G03F 7/709 355/72 |

FOREIGN PATENT DOCUMENTS

| | | |
|---|---|---|
| JP | 2009-105417 | 5/2009 |
| JP | 2012-028784 | 2/2012 |
| JP | 2012-134484 | 7/2012 |
| WO | 02/077484 | 10/2002 |
| WO | 2013/050081 | 4/2013 |

OTHER PUBLICATIONS

International Search Report mailed Jan. 15, 2014 in corresponding International Patent Application No. PCT/EP2013/070891.

* cited by examiner

LITHOGRAPHIC APPARATUS AND DEVICE MANUFACTURING METHOD

CROSS-REFERENCE TO RELATED APPLICATIONS

This application is the U.S. national phase entry of PCT patent application no. PCT/EP2013/070891, which was filed on Oct. 8, 2013, which claims the benefit of priority of U.S. provisional application No. 61/723,214, which was filed on Nov. 6, 2012, and which is incorporated herein in its entirety by reference.

FIELD

The present invention relates to a lithographic apparatus and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

SUMMARY

A lithographic apparatus may vibrate (for example, at around 200 Hz). Vibrations of the lithographic apparatus can have a negative impact on, for example, reproducibility.

It is desirable, for example, to mitigate for one or more effects of such vibration.

According to an aspect of the invention, there is provided a device manufacturing method comprising transferring a pattern from a patterning device onto a substrate, wherein the method comprises: using one or more first sensors comprised within a lithographic apparatus to obtain first calibration vibration data relating to vibrations of the lithographic apparatus, using a second sensor to obtain second calibration vibration data, the second calibration vibration data being a component of first parameter data of the lithographic apparatus; and using the first calibration vibration data and second calibration vibration data to calculate a filter, the filter being operable such that when applied to the first calibration vibration data, its output correlates closer with the second calibration vibration data.

According to an aspect of the invention, there is provided a lithographic apparatus being operable to transfer a pattern from a patterning device onto a substrate, and comprising one or more first sensors, wherein the lithographic apparatus is operable to: use the one or more first sensors to obtain first calibration vibration data relating to vibrations of the lithographic apparatus, use a second sensor to obtain second calibration vibration data, the second calibration vibration data being a component of first parameter data of the lithographic apparatus; and use the first calibration vibration data and second calibration vibration data to calculate a filter, the filter being operable such that when applied to the first calibration vibration data, its output correlates closer with the second calibration vibration data.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
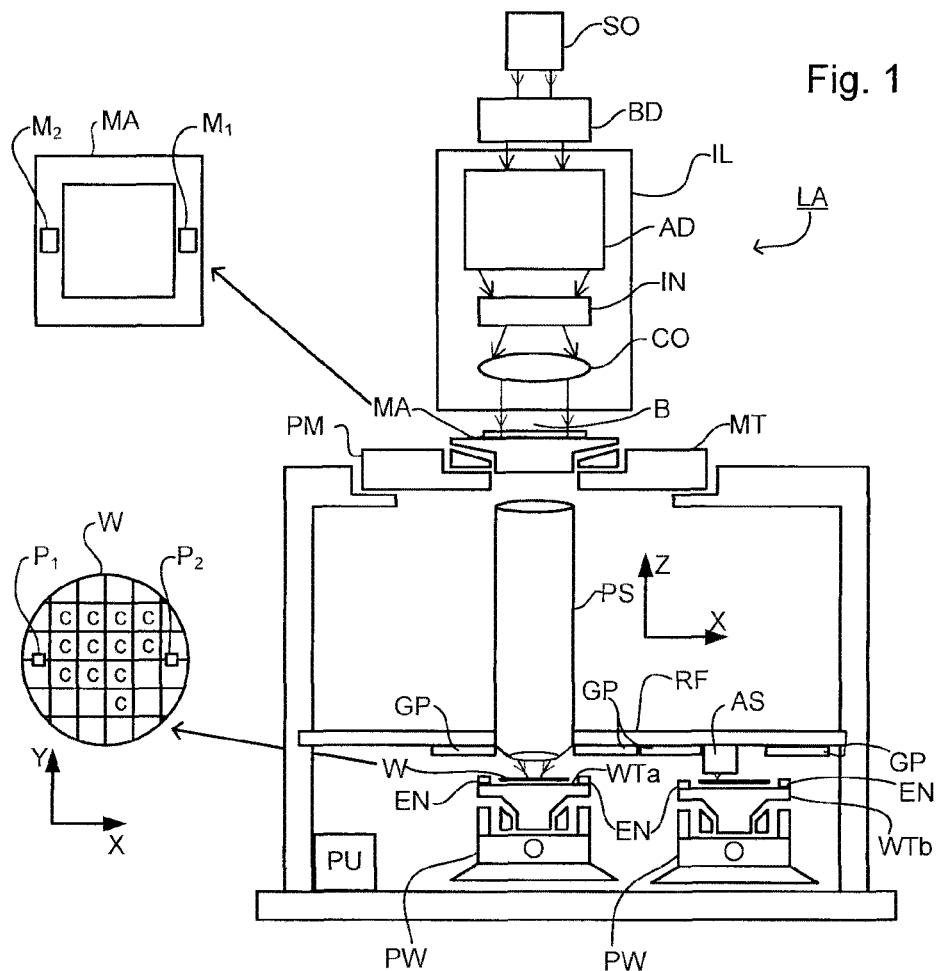
FIG. 1 depicts a lithographic apparatus according to an embodiment of the invention.

FIG. 1 schematically depicts a lithographic apparatus according to one embodiment of the invention. The apparatus comprises:

an illumination system (illuminator) IL configured to condition a radiation beam B (e.g. UV radiation or EUV radiation).

a support structure (e.g. a mask table) MT constructed to support a patterning device (e.g. a mask) MA and connected to a first positioner PM configured to accurately position the patterning device in accordance with certain parameters;

a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the mask MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-) magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA may be a so-called dual stage type which has two tables WTa and WTb and two stations—an exposure station and a measurement station—between which the tables can be exchanged. For example, while one substrate on one substrate table is being exposed at the exposure station, another substrate can be loaded onto the other substrate table at the measurement station so that various preparatory steps may be carried out. In an embodiment, one table is a substrate table and another table is a measurement table including one or more sensors. Preparatory steps may be performed at the measurement station such as mapping the surface of the substrate using a level sensor (not shown) and/or measuring the position of one or more alignment markers on, for example, the substrate using an alignment sensor AS. Such preparatory steps enable a substantial increase in the throughput of the apparatus.

The position sensor apparatus in this embodiment is capable of measuring the position of the substrate table while it is at the measurement station as well as at the exposure station. The position sensor apparatus comprises one or more encoder parts (e.g., a sensor) EN on one or each of the tables WTa, WTb; and one or more associated encoder parts (e.g., a reference plate which may be a 1D or 2D grid plate) GP fixed to the apparatus frame RF. A position of the table WTa, WTb in respect of encoder part GP, and therefore in respect of the apparatus frame RF, is measured by the combined operation of encoder parts EN, GP. This is referred to as stage position measurement (SPM). If the position sensor is not capable of measuring the position of the table while it is at the measurement station as well as at the exposure station, a second position sensor may be provided to enable the positions of the table to be tracked at both stations. The apparatus further includes a processing unit PU which controls the movements and measurements of the various actuators and sensors described.

Figure 2:
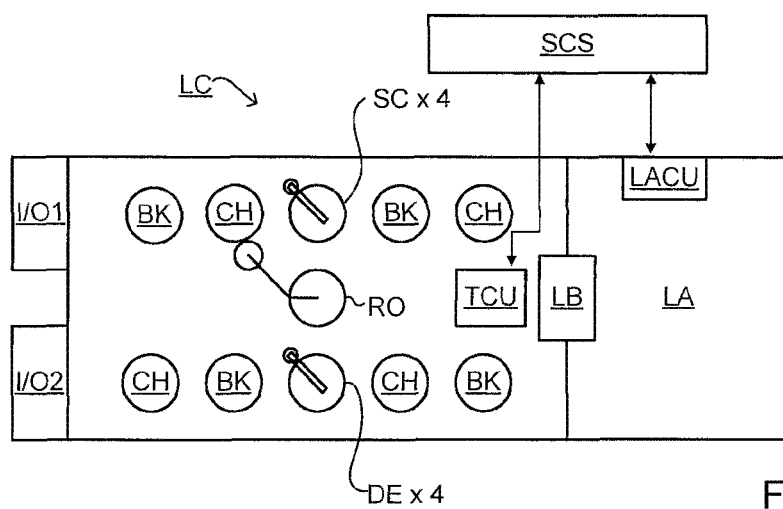
FIG. 2 depicts a lithographic cell or cluster according to an embodiment of the invention.

As shown in FIG. 2, the lithographic apparatus LA may be part of a lithographic cell LC, also sometimes referred to a 'lithocell' or cluster, which also includes apparatus to perform pre- and/or post-exposure processes on a substrate. Conventionally this lithographic cell LC may include one or more spin coaters SC to deposit resist layers, one or more developers DE to develop exposed resist, one or more chill plates CH and/or one or more bake plates BK. A substrate handler, or robot, RO picks up a substrate from an input/output port I/O1, I/O2, moves it between one or more different process apparatuses and delivers it then to the loading bay LB of the lithographic apparatus. These one or more devices, often collectively referred to as the track, are under the control of a track control unit TCU which is itself controlled by the supervisory control system SCS, which also controls the lithographic apparatus via lithography control unit LACU. Thus, the different apparatus can be operated to maximize throughput and processing efficiency.

The lithographic apparatus may be subject to vibrations when in use. These vibrations can adversely affect various measurement and control processes that are part of a lithographic process. Accordingly, the vibration should be corrected for when performing these measurement and control processes. Ideally, the vibrations may be measured directly by one or more various sensors (either dedicated, or using data from sensors that have another primary purpose such as for example any of the position sensors described in relation to FIG. 1) during the process being performed, and the appropriate corrections are calculated using these direct measurements. However, there are situations in which, for a number of reasons, direct measurement of vibrations as "seen" and/or experienced by a particular sensor or component part of the apparatus, or the vibration components present in any machine parameter, cannot be made during normal machine operation.

One way of addressing this is to use vibration measurements which can be obtained during normal machine operation, such as those "seen" by a sensor on a different component of the lithographic apparatus, to calculate a correction for the parameter of interest. This can result in some improvement in the parameter of interest. However, the vibrations "seen" by one sensor are not always equal to vibrations experienced by another sensor/component, and therefore may not necessarily be the same as the vibration component of the parameter of interest. As a result there may be an error which is dependent upon the difference of the vibration component of the parameter of interest and the vibrations actually measured.

To address this, it is proposed to calculate a filter which may be applied to the measurable vibrations so that they more closely resemble the vibration component of the parameter of interest. The filtered vibration data can then be used to correct the parameter of interest during machine operation.

Figure 3A:
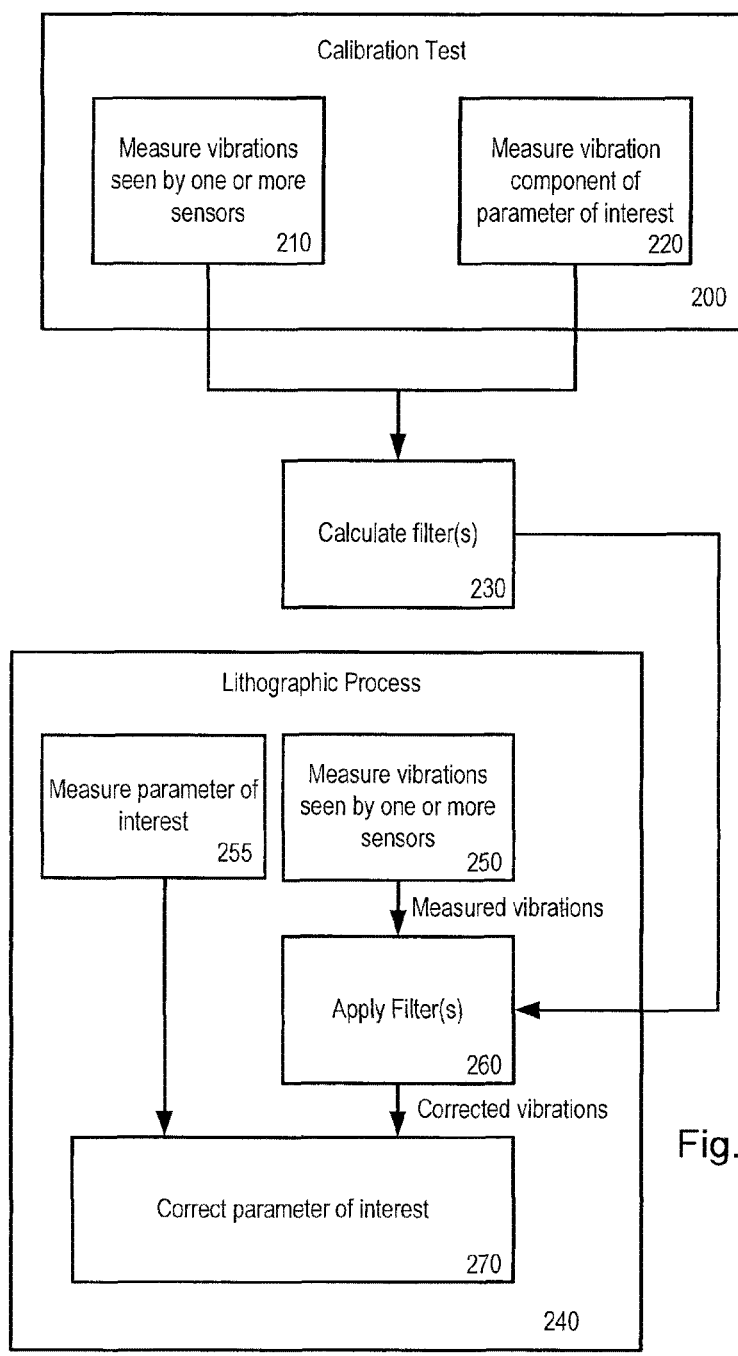
FIG. 3a is a flowchart depicting a method according to a first embodiment of the invention.

FIG. 3a is a flowchart illustrating an embodiment of the proposed methodology. At step 200 a dynamic calibration test is performed in order to obtain the data from which a suitable filter can be calculated. Depending on the parameter of interest and sensor measurements taken, such a dynamic calibration test may be similar to that of a static scan test in which vibration measurements are obtained without a scan being performed (and therefore with the substrate table(s) static). In an embodiment of the calibration test, it should be the case that the dominant vibrational modes in the machine which are present during regular machine operation and which should be compensated for, are also present during the calibration test measurements. Consequently the calibration test may include some scanning operations, should vibrational components of the parameter of interest include vibrations resultant from such scanning operations.

During the dynamic calibration test, vibrations (over time) as "seen" by one or more sensors are directly measured 210. The sensor may include any component or system of the lithographic apparatus capable of measuring vibration (or measuring a parameter from which vibration can be directly calculated). While this may include a dedicated vibration sensor, it may also include (for example) a stage position measurement system, an interferometer systems or the like. Also measured at the same time (step 220) are the vibrational components of the parameter of interest. This may be achieved by direct measurement of vibrations as "seen" by another device (a parameter of which comprises the parameter of interest) using the same or other sensor(s). In each case, multiple measurements at different times and locations may be made to obtain a stable inversion.

At step 230, the vibration data obtained at steps 210 and 220 is used to calculate one or more filters, each of which is able to modify vibration data measured from a respective sensor so that it more closely resembles the vibration data of the measured parameter of interest.

At a later time a lithographic process 240 is performed. This could be any one or more specific actions which may be carried out by a lithographic apparatus such as that of FIG. 1, including (for example) any scanning, metrology or control action. During the lithographic process, a parameter of interest is measured (step 255), the parameter of interest being subject to a vibrational component that cannot be directly measured during normal machine operation. At the same time (step 250), vibrations as "seen" by the one or more sensors used to obtain the vibrational data in step 210 (or at least a subset thereof) are measured. At step 260, the corresponding filter calculated at step 230 is applied to the measured vibration data obtained at step 250 in order to obtain corrected vibration data which should more closely resemble the vibrational component of the parameter of interest. At step 270, this corrected vibrational data is applied to the measured parameter of interest in order to correct for the vibrational component of the measured parameter of interest.

Figure 3B:
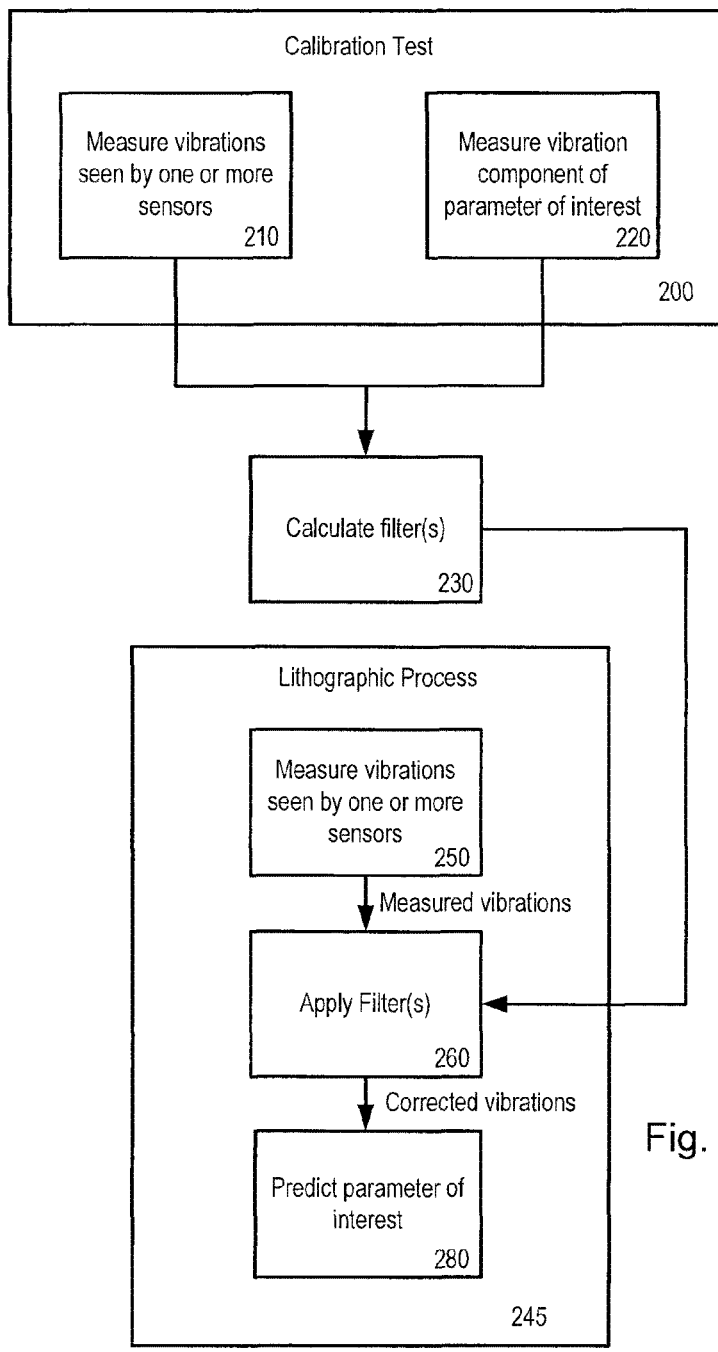
FIG. 3b is a flowchart depicting a method according to a second embodiment of the invention.

FIG. 3*b* is a flowchart illustrating a variation on the methodology shown in FIG. 3*a*. The method differs in the lithographic process 245. Instead of measuring the parameter of interest (FIG. 3*a*, step 255) and using the corrected vibrations output from step 260 to correct the parameter of interest (FIG. 3*a*, step 270), the method of FIG. 3*b* uses the corrected vibrations output from step 260 to predict the parameter of interest or the vibrational component of the parameter of interest. (step 280), without measurement.

The filter calculated at step 230 may be based upon cross-correlation and auto-correlation functions. For example the filter may comprises a function cross-correlating the data from step 210 with the data from step 220, and a function auto-correlating the data from step 210. A suitable function to calculate filter $H(\omega)$ is shown below, where $X_{210}(\omega)$ represents the (Fourier transformed) vibration measurements obtained at step 210 (optionally summed over a number of calibration tests) and $X_{220}(\omega)$ represents the (Fourier transformed) vibration measurements obtained at step 220 (again optionally summed over a number of calibration tests):

$$H(\omega) = \frac{\sum_{calibration} X_{210}(\omega) \cdot X_{220}^*(\omega)}{\sum_{calibration} X_{220}(\omega) \cdot X_{220}^*(\omega)} \qquad \text{Equation 1}$$

The filter acts to promote vibration components that show correlated behavior between the two sets of data, while suppressing vibration components "seen" only in the data measured at step 220.

The filter can then be used (at step 260) to estimate the vibrational component of the parameter of interest as follows:

$$X_{210}(\omega) \approx H(\omega) \cdot X_{220}(\omega) \qquad \text{Equation 2}$$

Figure 4:
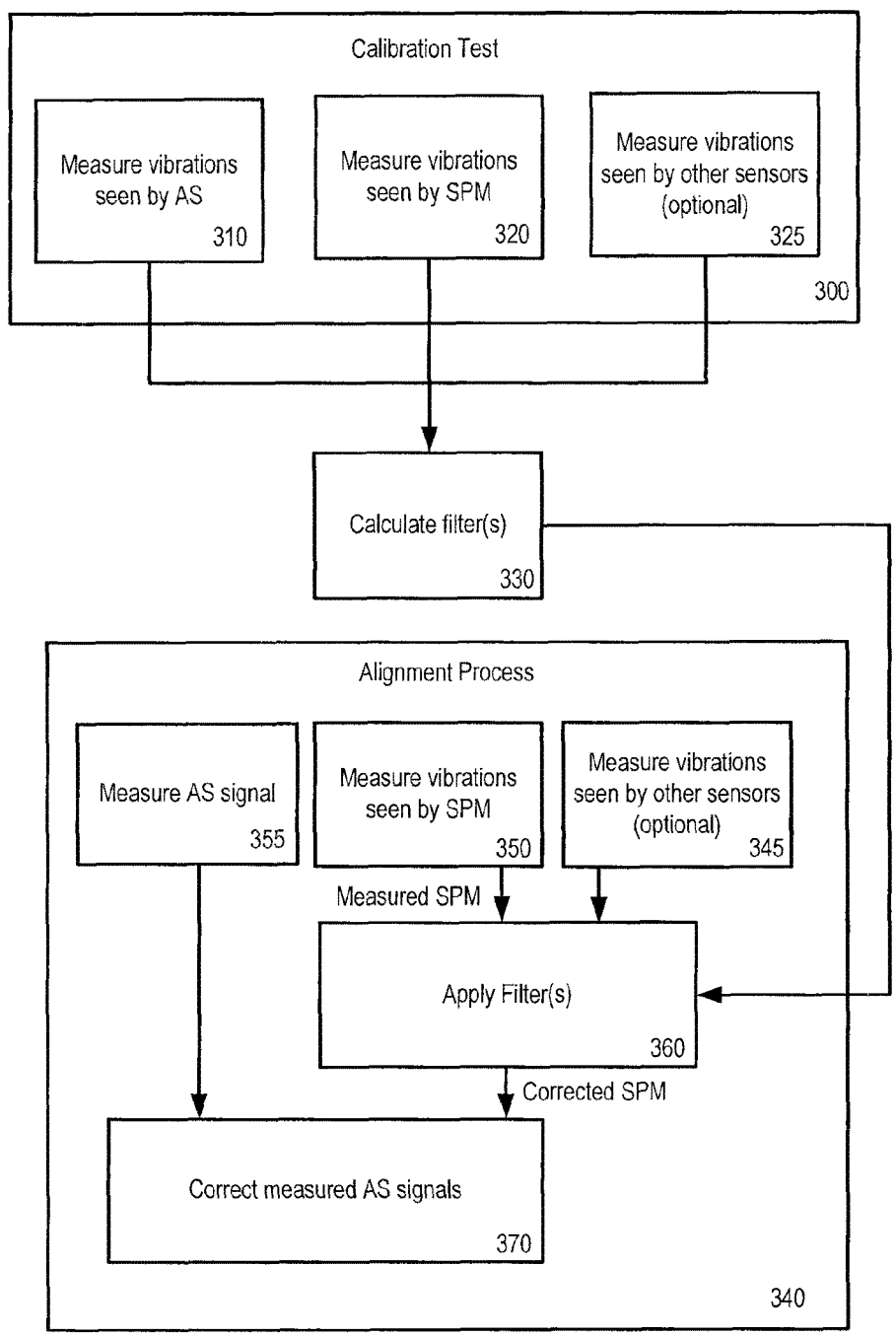
FIG. 4 is a flowchart depicting a method according to a third embodiment of the invention.

FIG. 4 is a flowchart illustrating a specific example of the proposed methodology, for illustration. The metrology frame RF of the lithographic apparatus may vibrate. Consequently, one or more encoder parts GP vibrate, as does the alignment sensor AS. The encoder part EN on the table WTa, WTb used to obtain SPM data can be used, for example, as an additional "sensor" to measure and correct for internal vibrational modes in the table WTa, WTb. The vibrations "seen" by the SPM system may be used to make corrections for the alignment sensor vibrations during an alignment process. As a result there may be a positional error of the alignment sensor AS which is dependent upon the difference of the vibrations "seen" by the alignment sensor and those "seen" by the SPM system. This error impacts on the alignment scan reproducibility/accuracy. A first step to improve the mismatch of the alignment sensor AS and SPM system vibrations may be the introduction of a dedicated vibration sensor, which measures vibration of the encoder parts GP with respect to the alignment sensor AS. These vibration sensor signals can be added to the SPM signal to create a new more representative SPM signal. However a vibration mismatch may still remain.

Moreover, in the future, it is proposed to perform alignment scans in a much shorter scan time, using fewer and shorter alignment marks than at present. The small amount of alignment data available and the small size of the marks (and their corresponding alignment signals) means that it may not be possible to directly measure (and therefore filter out) the vibrations "seen" by the alignment sensor from the alignment data.

SPM data, including that of vibrations "seen" by the SPM system, is much more readily available as stage position measurements are constantly being made. Consequently, in this example, SPM data (and optionally vibration sensor data) may be used to correct for alignment sensor vibration. This measured SPM vibration data is then filtered so that it more closely matches the vibrations as actually "seen" by the alignment sensor.

At step 300 a dynamic calibration test is performed in order to obtain the data from which a suitable filter can be calculated. As before, such a dynamic calibration test may be similar to that of a static scan test in which vibration measurements are obtained without a scan being performed (and therefore with the substrate table(s) static). The one or more dominant vibrational modes in the machine present during regular alignment scan and that should be compensated for, should also be present during the calibration test measurements. Therefore the static scan test may be adapted into a "scanning" static scan test. This may comprise, for example, scanning over a special substrate multiple times and acquiring obtaining both alignment sensor, SPM and other vibration data from these measurements. In this way vibrational modes caused by the movement (velocity, acceleration, jerk and snap), which are missing in a normal static scan test, will be present in the "scanning" static scan test.

During the dynamic calibration test, vibrations (over time) "seen" by the SPM system are measured 320, as are vibrations "seen" by the alignment sensor 310. Optionally, at step 325, vibration measurement from any other available sensor (such as a dedicated vibration sensor) may be measured. In each case, multiple measurements at different times and locations may be made to obtain a stable inversion. At step 330, the vibration data obtained at steps 310, 320 and optionally 325 is used to calculate one or more filters, each of which is able to modify SPM vibration data from step 320, or optionally from (one of) the sensor(s) from step 325 so that it more closely resembles the vibration "seen" by the alignment sensor measured in step 310.

The filter may be designed with multiple channels, so as to handle other variables, such as measured vibration data in different directions (x, y and z directions). The equations below show how such multiple input channels can be handled (this treatment is equally applicable to the more generalized forms of the equations labeled equation 1 and equation 2 above).

$$X_{AS}(\omega) \approx \sum_{i=1}^{N} H(\omega) \cdot X_i(\omega)$$

$$h(\omega) = M(\omega)^{-1} v(\omega) \text{ (matrix multiplication)}$$

$$M(\omega) = \begin{pmatrix} \sum_{static\ scans} X_1(\omega) \cdot X_1^*(\omega) & \sum_{static\ scans} X_2(\omega) \cdot X_1^*(\omega) & \sum_{static\ scans} X_3(\omega) \cdot X_1^*(\omega) \\ \sum_{static\ scans} X_1(\omega) \cdot X_2^*(\omega) & \sum_{static\ scans} X_2(\omega) \cdot X_2^*(\omega) & \sum_{static\ scans} X_3(\omega) \cdot X_2^*(\omega) \\ \sum_{static\ scans} X_1(\omega) \cdot X_3^*(\omega) & \sum_{static\ scans} X_2(\omega) \cdot X_3^*(\omega) & \sum_{static\ scans} X_3(\omega) \cdot X_3^*(\omega) \end{pmatrix}$$

$$v(\omega) = \begin{pmatrix} \sum_{static\ scans} X_{AS}(\omega) \cdot X_1^*(\omega) \\ \sum_{static\ scans} X_{AS}(\omega) \cdot X_2^*(\omega) \\ \sum_{static\ scans} X_{AS}(\omega) \cdot X_3^*(\omega) \end{pmatrix}$$

$$h(\omega) = \begin{pmatrix} H_1(\omega) \\ H_2(\omega) \\ H_3(\omega) \end{pmatrix}$$

At a subsequent time, such as during an alignment scan 340, the SPM system is used to measure vibrations 350 at the same time as alignment sensor signals are obtained (step 355). In addition, one or more other sensors may be used to measure vibrations (step 345). At step 360, the corresponding filter calculated at step 330 is applied to the measured SPM vibration data, to obtain a better estimate of the vibrations "seen" by the alignment sensor. Similarly, a filter corresponding to the other vibration sensor(s) may be applied to the vibrations measured at step 345. At step 370, the results of the alignment scan are corrected for vibration of the alignment sensor as estimated in step 360.

The filter calculated in accordance with equation 1, and may take the following form:

$$H(\omega) = \frac{\sum_{static\ scans} X_{AS}(\omega) \cdot X_{SPM}^*(\omega)}{\sum_{static\ scans} X_{SPM}(\omega) \cdot X_{SPM}^*(\omega)}$$

where $X_{AS}(\omega)$ are the (Fourier transformed) vibration measurements from the alignment sensor AS and $X_{SPM}(\omega)$ are the (Fourier transformed) vibration measurements from the encoder part GP.

The filter can then be used (at step 360) to estimate the alignment sensor vibrations as follows (based on equation 2):

$$X_{AS}(\omega) \approx H(\omega) \cdot X_{SPM}(\omega)$$

and in order to stabilize matrix $M(\omega)$, as it cannot be inverted (M is a self-adjoint matrix with real eigenvalues):

$$M = VDV^*$$

$$M^{-1} = VD_{inv}V^*$$

$$D = \begin{pmatrix} d_1 & 0 & 0 \\ 0 & d_2 & 0 \\ 0 & 0 & d_3 \end{pmatrix}$$

$$D_{inv} = \begin{pmatrix} dinv_1 & 0 & 0 \\ 0 & dinv_2 & 0 \\ 0 & 0 & dinv_3 \end{pmatrix}$$

$$dinv_i = \begin{cases} \frac{1}{d_i} & \text{if } |d_i| > \lambda \cdot \max_i(|d_i|) \\ 0 & \text{otherwise} \end{cases}$$

At high scan speeds, a reproducibility improvement of a factor of three can be obtained, while at scan speeds used presently, a significant improvement is still "seen".

The above example relates to mitigating for the effects of vibrations as "seen" by the alignment sensor. It should be appreciated that the concepts disclosed herein are applicable more generally to processes other than substrate alignment. A filter may be calculated in order to estimate vibrations "seen" by any other sensor, from other measured vibration data using the techniques described herein. This may include (for example) any sensor on the exposure side of the machine (e.g. a reticle stage sensor, lens aberration sensor, transmission image sensor).

A further specific example may comprise applying the concepts disclosed herein to a system comprising of a substrate stage with a first SPM system (WS SPM) and a patterning device (e.g., reticle) stage with a second SPM system (RS SPM). In such an example, the "parameter of interest" may be the vibration of the pattern image from the patterning device on the substrate (which equates to overlay). This system could be extended with one or more relevant vibration sensors in the imaging system or possibly the illumination optics. When the substrate is being exposed (this being the lithographic process 240 of FIG. 3a, for this example), the method may determine/predict the exposure error (vibrations in the exposure image on the substrate which cannot be measured directly) by filtering the measured RS SPM data, the measured WS SPM data and data from the imaging lens and/or illumination optics vibration sensor. To calculate the filter, a calibration operation may use a sensor inside the substrate stage to measure the vibrations of the image directly, when there is no substrate on the substrate stage.

Figure 5:
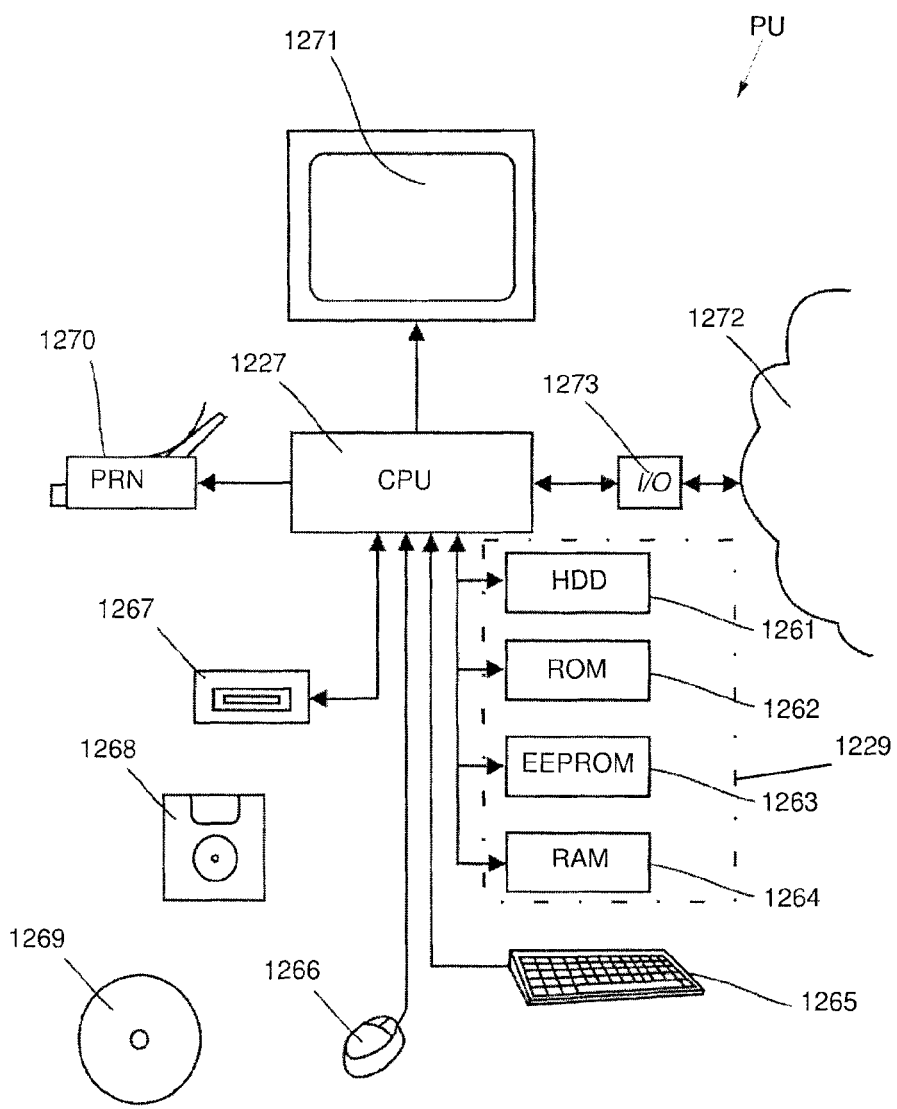
FIG. 5 is a view of a processing unit (computer system) controlling the apparatus and the method according to embodiments of the invention.

It should be understood that the processing unit PU in the embodiments herein may be a computer assembly as shown in FIG. 5. The computer assembly may be a dedicated computer in the form of a control unit in embodiments of the assembly or, alternatively, be a central computer controlling the lithographic projection apparatus. The computer assembly may be arranged to load a computer program product comprising computer executable code. This may enable the computer assembly, when the computer program product is loaded, to control the method of FIG. 3a, FIG. 3b or FIG. 4.

Memory 1229 connected to processor 1227 may comprise a number of memory components like a hard disk 1261, Read Only Memory (ROM) 1262, Electrically Erasable Programmable Read Only Memory (EEPROM) 1263 and/or Random Access Memory (RAM) 1264. It is not essential that any of the aforementioned memory components is physically in close proximity to the processor 1227 or to each other. They may be located at a distance away.

The processor 1227 may be connected to some kind of user interface, for instance a keyboard 1265 or a mouse 1266. A touch screen, track ball, speech converter or other interfaces that are known in the art may be used.

The processor 1227 may be connected to a reading unit 1267, which is arranged to read data, e.g. in the form of computer executable code, from and under some circumstances store data on a data carrier, like a floppy disc 1268 or a CDROM 1269. Also flash memory, DVDs or other data carriers known in the art may be used.

The processor 1227 may be connected to a printer 1270 to print out output data on paper as well as to a display 1271, for instance a monitor or LCD (Liquid Crystal Display), of any other type of display known in the art.

The processor 1227 may be connected to a communications network 1272, for instance a public switched telephone network (PSTN), a local area network (LAN), a wide area network (WAN) etc. by way of one or more transmitters/receivers 1273 responsible for input/output (I/O). The processor 1227 may be arranged to communicate with other communication systems via the communications network 1272. In an embodiment, external computers (not shown), for instance personal computers of operators, can log into the processor 1227 via the communications network 1272.

The processor 1227 may be implemented as an independent system or as a number of processing units that operate in parallel, wherein each processing unit is arranged to execute sub-tasks of a larger program. The processing units may be divided in one or more main processing units with several sub-processing units. Some processing units of the processor 1227 may be located a distance away of the other processing units and communicate via communications network 1272.

Although connections in FIG. 1 may be shown as physical connections, one or more of these connections may be wireless. They are only intended to show that "connected" units are arranged to communicate with one another in someway. The computer system can be any signal processing system with analog and/or digital and/or software technology arranged to perform the functions discussed here.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a The descriptions above are intended to be illustrative, not limiting. Thus, it will be apparent to one skilled in the art that modifications may be made to the invention as described without departing from the scope of the claims set out below.

The invention claimed is:

1. A device manufacturing method comprising transferring a pattern from a patterning device onto a substrate, wherein the method comprises:
    using a sensor system within a lithographic apparatus to obtain first calibration vibration data relating to vibration of the lithographic apparatus;
    using the sensor system to obtain second calibration vibration data, the second calibration vibration data being a component of first parameter data of the lithographic apparatus; and
    using the first calibration vibration data and second calibration vibration data to calculate a filter, the filter being operable such that when applied to the first calibration vibration data, its output correlates closer with the second calibration vibration data.

2. The method of claim 1, further comprising, during a lithographic process:
    measuring the first parameter data of the lithographic apparatus;
    using the sensor system within the lithographic apparatus to obtain first process vibration data; and
    applying the filter to the first process vibration data to obtain an estimate of a vibration component of the first parameter data during the lithographic process.

3. The method of claim 2, further comprising using the estimate of a vibration component of the first parameter data to adjust for a vibration component in the measured first parameter data.

4. The method of claim 2, wherein the first calibration vibration data and second calibration vibration data are obtained during a calibration operation during which time a dominant vibration component in the lithographic apparatus during the lithographic process is present.

5. The method of claim 2, wherein the vibration component of the first parameter data is such that it is not possible to directly measure it during the lithographic process.

6. The method of claim 1, further comprising, during a lithographic process:
    using the sensor system within the lithographic apparatus to obtain first process vibration data; and
    applying the filter to the first process vibration data to obtain an estimate of the first parameter data during the lithographic process.

7. The method of claim 1, wherein the sensor system comprises a plurality of sensors used to obtain plural sets of first calibration vibration data, and a filter is calculated for each of the plural sets of first calibration vibration data.

8. The method of claim 1, wherein the lithographic apparatus comprises a patterning device support control apparatus configured to control a patterning device support, wherein the sensor system within the lithographic apparatus comprises a sensor within the patterning device support control apparatus, the sensor within the patterning device support control apparatus being primarily used to obtain positional measurement data for the patterning device support control apparatus.

9. The method of claim 1, wherein the lithographic apparatus comprises a substrate support control apparatus configured to control a substrate support, wherein the sensor system within the lithographic apparatus comprises a sensor within the substrate support control apparatus, the sensor within the substrate support control apparatus being primarily used to obtain positional measurement data for the substrate support control apparatus.

10. The method of claim 1, wherein the sensor system comprises a single sensor to sensor to obtain the first calibration vibration data and the second calibration vibration data.

11. The method of claim 1, wherein the sensor system comprises a first sensor to obtain the first calibration vibration data and a second different sensor to obtain the second calibration vibration data.

12. A non-transitory computer program product comprising one or more sequences of machine-readable instructions configured to control a suitable apparatus such that it performs a method comprising:
    using a sensor system within a lithographic apparatus to obtain first calibration vibration data relating to vibration of the lithographic apparatus;
    using the sensor system to obtain second calibration vibration data, the second calibration vibration data being a component of first parameter data of the lithographic apparatus; and
    using the first calibration vibration data and second calibration vibration data to calculate a filter, the filter being operable such that when applied to the first calibration vibration data, its output correlates closer with the second calibration vibration data.

13. A lithographic apparatus configured to transfer a pattern from a patterning device onto a substrate, and comprising a sensor system, wherein the lithographic apparatus is configured to:
    use the sensor system of the lithographic apparatus to obtain first calibration vibration data relating to vibration of the lithographic apparatus;
    use the sensor system to obtain second calibration vibration data, the second calibration vibration data being a component of first parameter data of the lithographic apparatus; and
    use the first calibration vibration data and second calibration vibration data to calculate a filter, the filter being operable such that when applied to the first calibration vibration data, its output correlates closer with the second calibration vibration data.

14. The lithographic apparatus of claim 13, wherein the apparatus is further configured to, during a lithographic process:
    measure the first parameter data of the lithographic apparatus;
    use the sensor system of the lithographic apparatus to obtain first process vibration data; and
    apply the filter to the first process vibration data to obtain an estimate of a vibration component of the first parameter data during the lithographic process.

15. The lithographic apparatus of claim 14, wherein the apparatus is further configured to use the estimate of a vibration component of the first parameter data to adjust for a vibration component in the measured first parameter data.

16. The lithographic apparatus of claim 14, wherein the vibration component of the first parameter data is such that it is not possible to directly measure it during the lithographic process.

17. The lithographic apparatus of claim 14, wherein the sensor system comprises a plurality of sensors to obtain plural sets of first calibration vibration data, and a filter is calculated for each of the plural sets of first calibration vibration data.

18. The lithographic apparatus of claim 13, wherein the apparatus is further configured to, during a lithographic process:
use the sensor system of the lithographic apparatus to obtain first process vibration data; and
apply the filter to the first process vibration data to obtain an estimate of the first parameter data during the lithographic process.

19. The lithographic apparatus of claim 13, wherein the sensor system comprises an alignment sensor, wherein the lithographic process is an alignment process, and the first parameter data is alignment data obtained using the alignment sensor, the vibration component being caused by vibration of the alignment sensor.

20. The lithographic apparatus of claim 13, comprising a substrate support constructed to hold a substrate, and a substrate support control apparatus configured to control the substrate support, wherein the sensor system of the lithographic apparatus comprises a sensor within the substrate support control apparatus, the sensor within the substrate support control apparatus being primarily operable to obtain positional measurement data for the substrate support control apparatus.

21. The lithographic apparatus of claim 13, comprising a patterning device support constructed to hold a patterning device, and a patterning device support control apparatus configured to control the patterning device support, wherein the sensor system of the lithographic apparatus comprises a sensor within the patterning device support control apparatus, the sensor within the patterning device support control apparatus being primarily operable to obtain positional measurement data for the patterning device support control apparatus.

22. The lithographic apparatus of claim 13, wherein the first parameter data comprises overlay data and the vibration component comprises vibration of a patterning device image on a substrate.

* * * * *